United States Patent [19]

Ishida

[11] Patent Number: 5,077,580
[45] Date of Patent: Dec. 31, 1991

[54] IMAGE FORMING APPARATUS
[75] Inventor: Kazuhito Ishida, Nagoya, Japan
[73] Assignee: Brother Kogyo Kabushiki Kaisha, Nagoya, Japan
[21] Appl. No.: 607,668
[22] Filed: Nov. 1, 1990
[30] Foreign Application Priority Data
Nov. 21, 1989 [JP] Japan .................................. 1-302801
[51] Int. Cl.⁵ ............................................ G03B 27/32
[52] U.S. Cl. ........................................ 355/27; 355/30; 355/77
[58] Field of Search ....................... 355/27, 28, 30, 32, 355/50, 100, 77; 430/138

[56]  References Cited
U.S. PATENT DOCUMENTS
4,942,423  7/1990  Matsumoto et al. .................. 355/30
4,994,849  2/1991  Izaki et al. ............................ 355/27

Primary Examiner—Brian W. Brown
Assistant Examiner—Khanh Dang
Attorney, Agent, or Firm—Oliff & Berridge

[57] ABSTRACT

An image forming method and apparatus include a photosensitive recording medium having a latent image formed thereon and a developer sheet introduced to a pressure development unit for transfer of the latent image to the developer sheet. The developer sheet is then carried to an ejecting unit via a heat fixing unit where the developer sheet is subjected to heat fixing. First and second carriers carry the developer sheet from a feeding unit to the development unit and from the heat fixing unit to the ejecting unit, respectively. The first and second carriers have independent drive sources such that their speed of movement can be independently controlled.

20 Claims, 4 Drawing Sheets

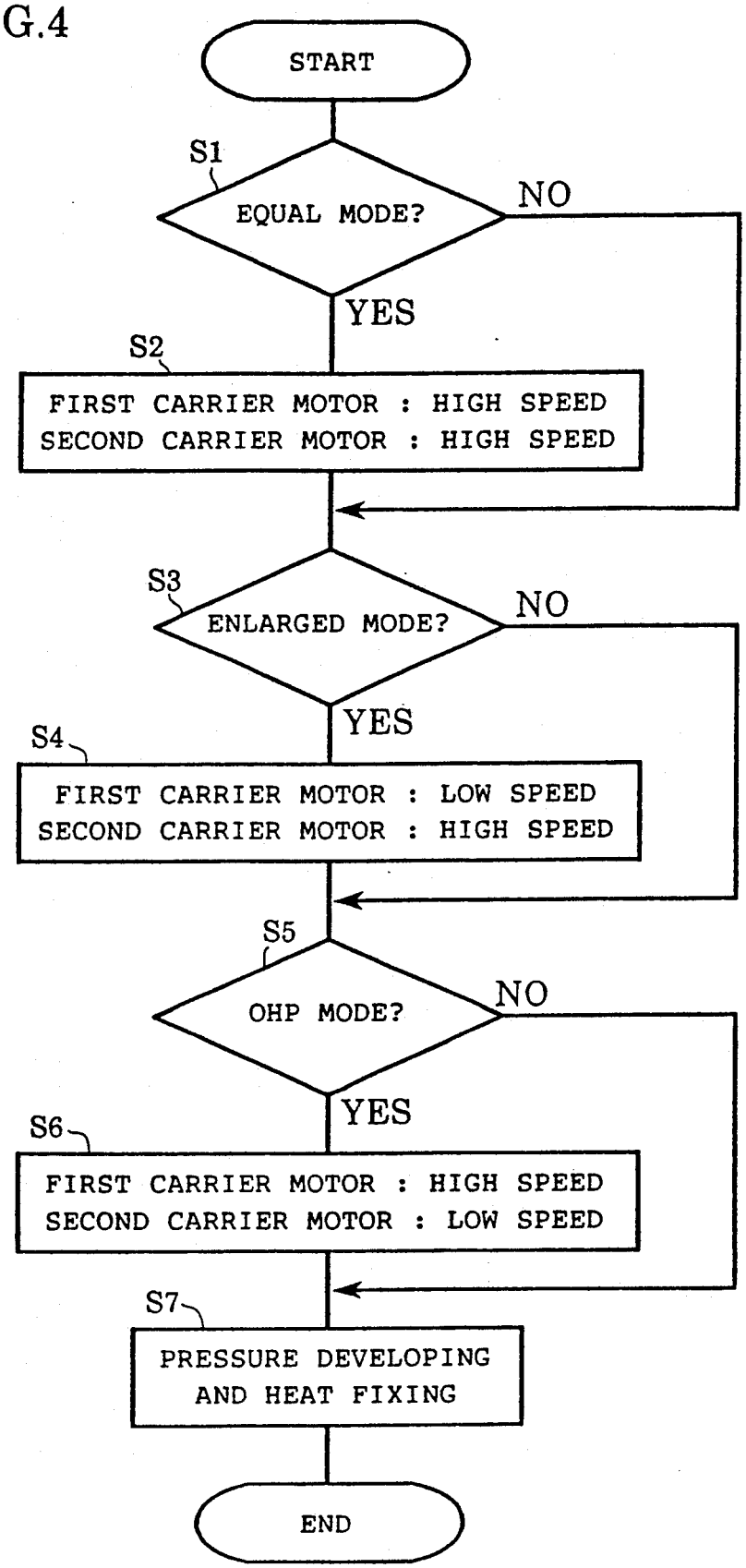

IMAGE FORMING APPARATUS

BACKGROUND OF THE INVENTION

1. Field of the Invention

The present invention relates to an image forming apparatus for use in copying machines or the like, and more specifically to a developer sheet feeding device used in the image forming apparatus.

2. Discussion of the Related Art

In conventional copying machines, a developer sheet is fed from a feed unit to a pressing and developing unit, and the developer sheet and a photosensitive recording medium on which a latent image is formed via an exposure unit are superposed together and pressed in the pressing and developing unit, whereby an image is transferred and developed on the developer sheet. Thereafter, the developer paper is fed to an ejecting unit via a heat fixing unit, and the image on the developer sheet is heated and fixed in the heat fixing unit.

In the copying machine of this kind, a first carrier means consisting of a plurality of rollers or the like for carrying the developer sheet from the feed unit to the pressing and developing unit and a second carrier means consisting of a plurality of rollers or the like for carrying the developer sheet from the heat fixing unit to the ejecting unit are driven by one and the same drive source, that is, a motor or the like so that the carrying period of the developer sheet from the feeding of the sheet to the ejection of the sheet via transfer, development and heat fixing is maintained constant.

In the conventional copying machines, however, light radiated on a photosensitive recording medium in the exposure unit becomes weak in an enlarged mode, and, therefore, the carrying speed of the photosensitive recording medium is set at a low speed. Accordingly, the carrying speed of the developer sheet is also set at a low speed so as to meet the carrying speed of the photosensitive recording medium. Accordingly, in the conventional machine in which the carrying time of the developer sheet from feeding to ejection via the transfer, development and heat fixing is maintained constant as described above, the lengthy time required for image formation in an enlarged mode or the like created a problem.

The heat fixing of a developer sheet is carried out at a temperature of from approximately 120° C. to 140° C. Glossiness and color development of an output image depend on the heat fixing temperature and heating time. In the past, therefore, the heat fixing temperature in an equal mode is set and controlled at about 140° C. whereas the heat fixing temperature in the enlarged mode is set and controlled at about 120° C. which is lower than that of the equal mode. The different temperatures maintain the constant glossiness and color development of the output image in the enlarged mode at which the carrying speed of the developer sheet is set at a low speed and in the equal mode at which the carrying speed is set at a high speed. Consequently, the temperature control becomes very cumbersome.

SUMMARY OF THE PRESENT INVENTION

A principal object of the present invention is to provide an image forming apparatus in which, even if a carrying speed of a photosensitive recording medium is low as required in an enlarged mode, only the carrying time of a developer sheet from feeding to transfer and development is set at a low speed so as to meet the carrying speed of the photosensitive recording medium, and the carrying time of the developer sheet from heat fixing to ejection can be set at a high speed to shorten a total time required for image formation.

A further object of the present invention is to provide an image forming apparatus in which temperature control of a heat fixing unit can be easily carried out without the necessity of changing the setting of a heat fixing temperature, thereby maintaining glossiness and color development of an outputted image constant in both an enlarged mode and an equal mode.

To achieve the foregoing and other objects and advantages, and to overcome the shortcomings discussed above, according to the present invention, there is provided an image forming apparatus in which a developer sheet is carried from a feeding unit to a pressing and developing unit, and a photosensitive recording medium on which a latent image is formed is placed on the developer sheet and pressed in the pressing and developing unit, whereby an image is transferred and developed on the developer sheet, and, thereafter, the developer sheet is carried to an ejecting unit via a heat fixing unit and the image on the developer sheet is subjected to heat fixing in the heat fixing unit. The image forming apparatus comprises a first carrier means for carrying the developer sheet from the feeding unit to the pressing and developing unit, a second carrier means for carrying the developer sheet after an image has been transferred and developed thereon from the heat fixing unit to the ejecting unit, a first drive source for driving the first carrier means, and a second drive source for driving the second carrier means, the relative speed between both drive sources being variable.

In the image forming apparatus constructed as described above, when the image formation is performed in an enlarged mode, the first carrier means for carrying the developer sheet from the feeding unit to the pressing and developing unit is driven at a relatively low speed so as to meet the carrying speed of the photosensitive recording medium by the first drive source, whereas the second carrier means for carrying the developer sheet after an image has been transferred and developed thereon from the heat fixing unit to the ejecting unit is driven at a relatively high speed by the second drive source. The photosensitive recording medium on which a latent image is formed is then placed on the developer sheet and pressed in the pressing and developing section, whereby an image is transferred and developed on the developer sheet, after which the image on the developer sheet is thermally fixed in the heat fixing unit.

Consequently, according to the image forming apparatus of the present invention, even if the carrying speed of the photosensitive recording medium is at a low level as in the enlarged mode, only the carrying time of the developer sheet from the feeding stage to the transfer and development stage is set at a low speed so as to meet the carrying time of the photosensitive recording medium and the carrying time of the developer sheet from the heat fixing stage to the ejection stage can be set at a high speed. The total time required for image formation can thus be shortened. Moreover, the setting of the heat fixing temperature need not be changed in order to maintain glossiness and color development of the output image constant in the enlarged mode and the equal mode, and the temperature control of the heat fixing unit can be easily performed.

BRIEF DESCRIPTION OF THE DRAWINGS

The present invention will be described in detail with reference to the following figures in which like reference numerals refer to like elements and wherein:

FIG. 4 is a flow chart explaining the operation of the carrying structure for a developer sheet.

DETAILED DESCRIPTION OF THE PREFERRED EMBODIMENTS

Figure 1:
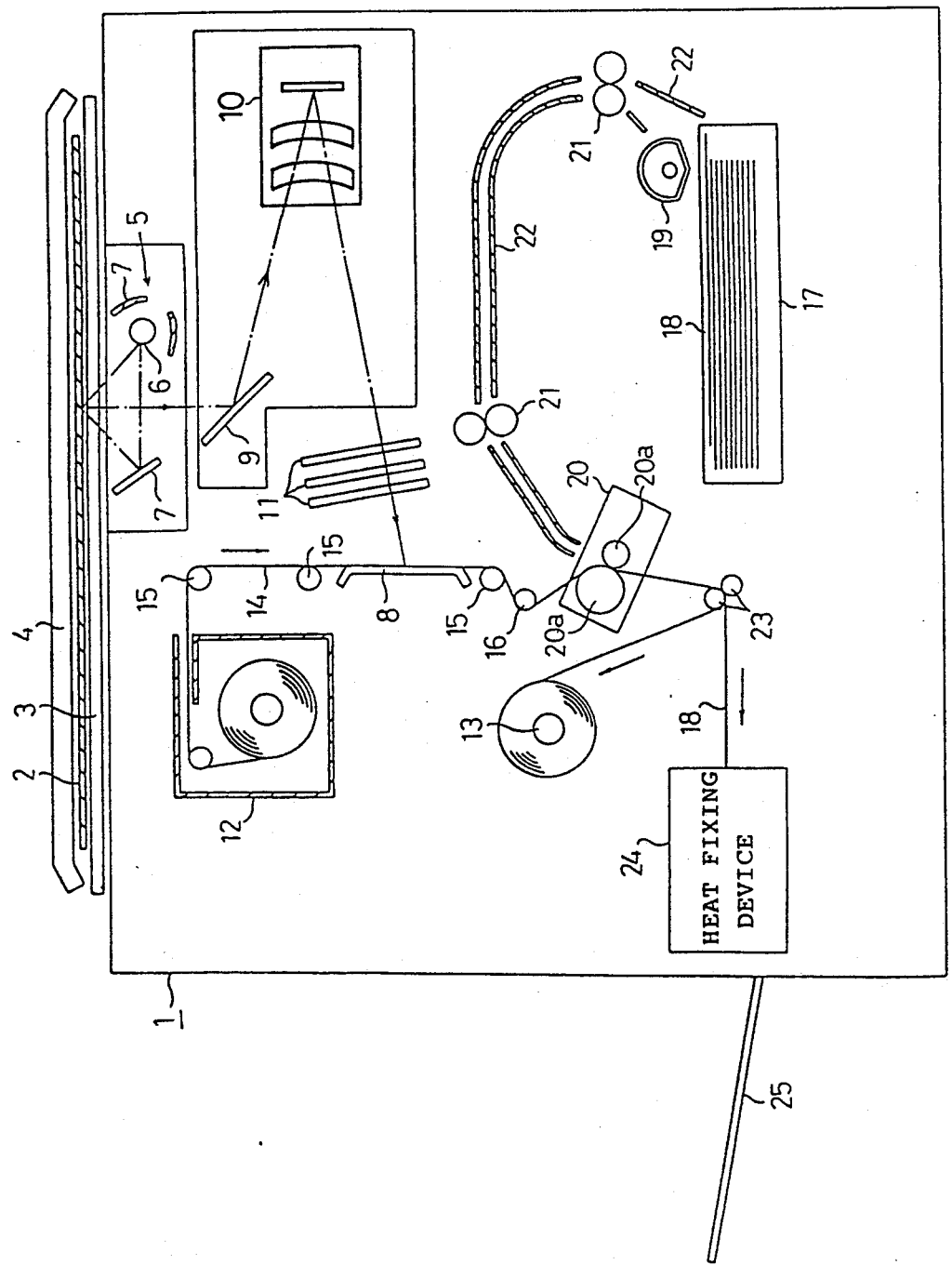
FIG. 1 is a sectional view showing the entire copying machine.

Referring now to the drawings and particularly to FIG. 1 thereof, an embodiment of the present invention is described in which the present invention is employed in a color copying machine.

As shown in FIG. 1, a copying machine body 1 has a box-shape, on the top of which a movable original bed glass 3, on which an original 2 is placed, and a movable cover 4 for openably covering the original 2 are provided. A light source 5 is disposed under the original bed glass and comprises a halogen lamp 6 extending in a direction perpendicular to the moving direction of the original bed glass 3 so as to irradiate light on the original 2 on the original bed glass 3, and a reflecting mirror 7 for reflecting light from the halogen lamp 6 toward the original 2 on the original bed glass 3. The original bed glass 3 is moved laterally while light is emitted from the light source 5, whereby the light is irradiated on the whole original 2.

An exposure bed 8 is disposed at an approximately central portion inside the copying machine body 1. Between the light source 5 and the exposure bed 8 are provided a position-adjustable reflecting mirror 9 for adjusting a light-path length and a focus, a condensing lens unit 10 and a filter 11 for adjusting a color tone of a copied image. The light reflected from the original 2 after being irradiated on the original 2 is guided to the side of the exposure bed 8 through the reflecting mirror 9, the lens unit 10 and the filter 11.

A cartridge 12 is detachably contained at an upper portion in the copying machine body 1, and a winding shaft 13 is rotatably supported in the vicinity of the lower portion of the copying machine body 1. An elongated microcapsule sheet 14 in the form of a photosensitive recording medium is contained in the cartridge 12 in a wound form. On the surface of the microcapsule sheet 14 is provided a microcapsule including a dye precursor reacted with a developer to develop color, a photosetting resin and the like. A plurality of feed rollers 15 are rotated to draw the microcapsule sheet 14 out of the cartridge 12, and the sheet is wound on a winding shaft 13 through the feed rollers 15 and a feed adjusting roller 16. When the sheet 14 passes through the side of the exposure bed 8, a part of the microcapsule sheet 14 is exposed to form a latent image thereon of the original 2.

A cassette 17 serves as a sheet feeding unit and is detachably mounted on the copying machine body 1 at the lower portion of the exposure bed 8. A developer sheet 18 in which a developer agent is coated on an ordinary sheet having a given size is contained in the cassette 17. A sheet feeding device 19 is disposed adjacent to the cassette 17 so that the developer sheets 18 are supplied one by one from the cassette 17 by the feeding device 19. A pressure developing device 20 serves as a pressing and developing unit and is disposed between the exposure bed 8 and the winding shaft 13. The exposed portion of the microcapsule sheet 14 and the developer sheet 18 are superposed together and pressed between a pair of pressing rollers 20a in the pressure developing device 20, whereby a color image resulting from the latent image on the microcapsule sheet 14 is transferred and developed on the developer sheet 18.

Feed rollers 21 and a sheet guide 22 are provided between the cassette 17 and the pressure developing device 20 so that, as the feed rollers 21 rotate, the developer sheet 18 is transported to the pressure developing device 20 along the sheet guide 22. Peeling rollers 23 are provided on the sheet delivery side of the pressure developing device 20 so that the developer sheet 18 is separated from the microcapsule sheet 14 by the peeling rollers 23. A heat fixing device 24 serves as a heat fixing unit and is disposed on the sheet delivery side of the peeling rollers 23 so that, after an image formed on the developer sheet 18 has been fixed by heat within the heat fixing device 24, the developer sheet 18 is ejected and contained in a tray 25 as an ejecting unit.

In preparing a color copy by the copying machine described above, the original 2 is placed on the original bed glass 3, and, thereafter, a start button (not shown) is depressed. The original bed glass 3 is moved to a moving end on the right-hand side, and the left end of the original 2 is arranged oppposedly to the halogen lamp 6 of the light source 5. The halogen lamp 6 is then lighted. At this stage, the original bed glass 3 is returned leftward, and irradiation of light to the original 2 is completed.

During the irradiation of light, the microcapsule sheet 14 on the exposure bed 8 is moved toward the winding shaft 13 at the same speed as that of the original bed glass 3. A latent image of the original 2 is therefore formed on the microcapsule sheet 14 by the light reflected from the original 2. The developer sheet 18 is transported from the cassette 17 to the pressure developing device 20 in synchronism with the leftward returning movement of the original bed glass 3, and the exposed portion of the microcapsule sheet 14 is pressed on the developer sheet 18 to transfer and develop a color image on the developer sheet 18. Thereafter, the developer sheet 18 is introduced into the heat fixing device 24, and the developer sheet 18 is discharged onto the tray 25 in the state where an image has been fixed by heat therein.

The heat fixing device 24 and the carrying structure for the developer sheet 18 will next be described in detail.

Figure 2:
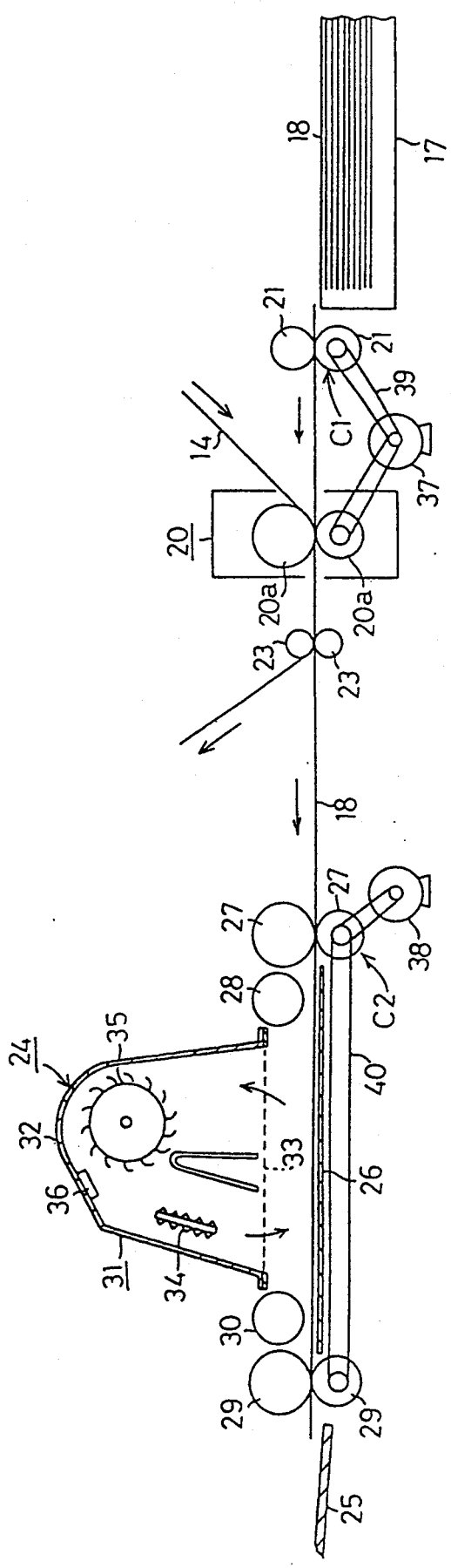
FIG. 2 is a sectional view showing the carrying structure for a developer sheet in a copying machine embodying the present invention.

As shown in FIG. 2, a sheet guide 26 is disposed under the carrying path of the developer sheet 18. A pair of upper and lower feed-in rollers 27 are rotatably disposed on the sheet feed-in side of the sheet guide 26, and a heat insulating roller 28 is provided in the vicinity of the upper feed-in roller 27. A pair of upper and lower feed-out rollers 29 are rotatably disposed on the sheet feed-out side of the sheet guide 26, and a heat insulating roller 30 is provided in the vicinity of the upper feed-out roller 29.

A hot air generator 31 is disposed opposedly to the upper surface of the sheet guide 26 in such a manner as to be positioned above the carrying passage of the developer sheet 18. The hot air generator 31 is provided with a casing 32 and a wire net 33 on a lower opening thereof. A heater 34 made of a coiled nichrome wire as a heat generating member is opposedly arranged in parallel with a wall surface on the sheet feed-out side inside the casing 32 so that the heater 34 extends in a direction perpendicular to the carrying direction of the developer sheet 18. A blower fan 35, or a cross-flow fan as a blower means is supported rotatably about an axis parallel with the extending direction of the heater 34 inside the casing 32 so that the blower fan 35 is rotated counter-clockwise in FIG. 2 by a motor (not shown), to thereby blow heat radiated from the heater 34 toward the developer sheet 18 on the sheet guide 26.

A temperature sensor 36 serving as a thermistor is housed inside the casing 32 of the hot air generator 31. When the developer sheet 18 is heated by the hot air generator 31, a heating temperature of the developer sheet is detected by the temperature sensor 36 and the detection signal thereof is outputted.

In this embodiment, a first carrier device C1 comprising a first carrier means is constituted of feed rollers 21 for carrying the developer sheet 18 from the cassette 17 to the pressure developing device 20, pressing rollers 20a and the like. Further, a second carrier device C2 comprising a second carrier means is constituted of feed-in rollers 27 for carrying the developer sheet 18 from the heat fixing device 24 to the tray 25, feed-out rollers 29 and the like.

First and second carrier motors 37 and 38 are independent drive sources corresponding to the first and second carrier devices C1 and C2. The first and second carrier devices C1 and C2 are separately driven by the motors 37 and 38 through transmission mechanisms 39 and 40, which are belts or gears. The two motors 37 and 38, respectively, are pulse motors or the like, and the relative speed can be changed.

In this embodiment, a distance between the pressing roller 20a of the pressure developing device 20 and the feed-in roller 27 of the heat fixing device 24 is longer than the length of the developer sheet 18 having the maximum dimension used so that the developer sheet 18 is not carried across the first and second carrier devices C1 and C2.

A control circuit for the carrying structure for the developer sheet 18 including the pressure developing device 20 and the heat fixing device 24 constructed as described above will now be described.

Figure 3:
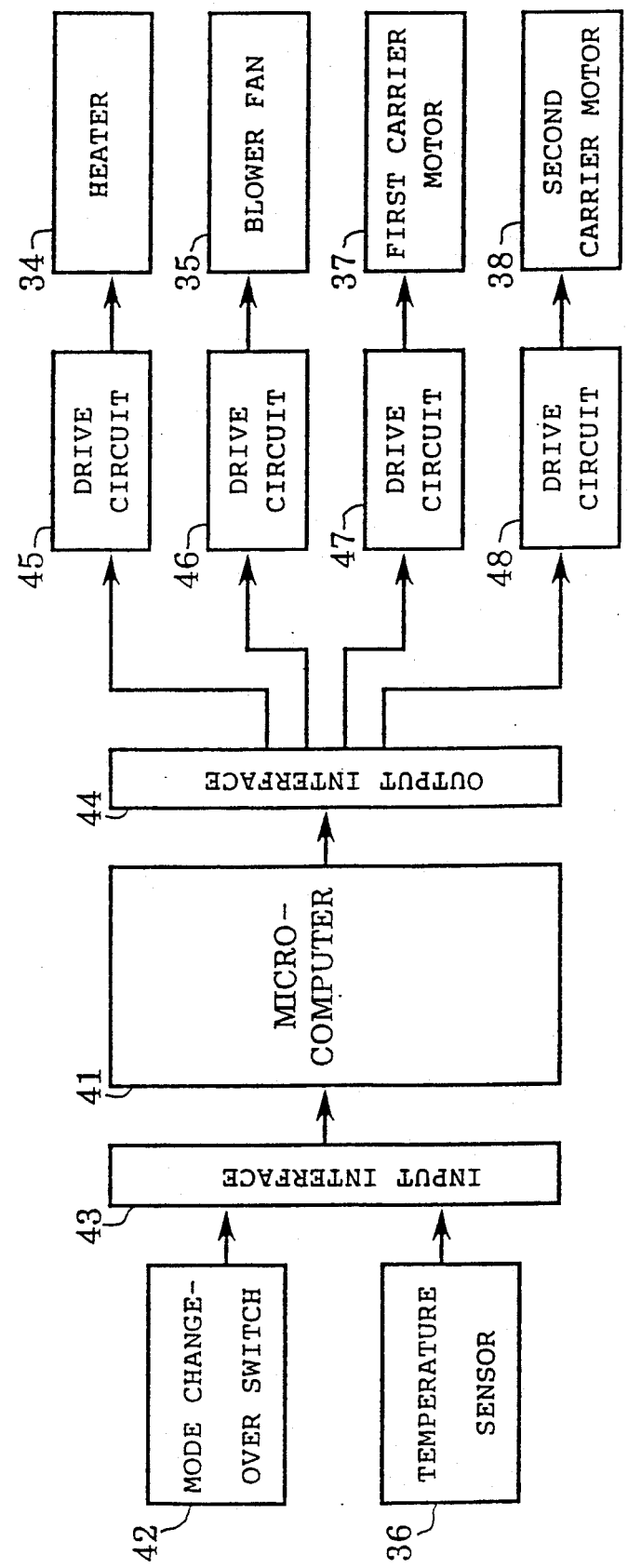
FIG. 3 is a block diagram showing a control circuit of the carrying structure for a developer sheet including a pressure developing device and a heat fixing device.

As shown in FIG. 3, a microcomputer 41 constitutes a control means. The microcomputer 41 receives various signals from a mode change-over switch 42 for switching a copy mode and from the temperature sensor 36 through an input interface 43. Operation and inoperation signals are outputted from the microcomputer 41 to the heater 34, the blower fan 35, the first carrier motor 37 and the second carrier motor 38 through an output interface 44 and drive circuits 45 to 48.

In heating and fixing the developer sheet 18, the microcomputer 41 compares a temperature detection signal from the temperature sensor 36 with a set temperature stored in advance in microcomputer 41 to turn on and off the heater 34 of the hot air generator 31 in order to allow the temperature detection signal to approach the set temperature. The set temperature stored in advance in the microcomputer 41 is approximately 130° C.

In carrying the developer sheet 18, the microcomputer 41 discriminates the mode state set by the mode change-over switch 42 so that when the equal mode is set, the first and second carrier motors 37 and 38 are rotated at a high speed, whereas when the enlarged mode is set, the first carrier motor 37 is rotated at a low speed and the second carrier motor 38 is rotated at a high speed. In the case where an overhead projector (OHP) mode for forming an image on a transparent OHP sheet in which a developer agent is coated on the surface of a base sheet made of polyethylene terephthalate is set, the microcomputer 41 causes the first carrier motor 37 to rotate at a high speed and causes the second carrier motor 38 to rotate at a low speed.

The operation of the carrying structure for the developer sheet 18 in the copying machine constructed as described above will now be described with reference to the flow chart of FIG. 4.

When the developer sheet 18 is delivered from the cassette 17, the microcomputer 41 first determines whether or not an equal mode is set by the mode change-over switch 42. If the equal mode is set, the first and second carrier motors 37 and 38 are rotated at a high speed (Steps S1 and S2). Next, it is determined whether or not an enlarged mode is set, and if the enlarged mode is set, the first carrier motor 37 is rotated at a low speed and the second carrier motor 38 is rotated at a high speed so that only the carrying speed of the developer sheet 18 from the feeding stage to the transfer and development stage is at a low speed so as to meet the carrying speed of the microcapsule sheet 14 (Steps S3 and S4). Further, it is determined whether or not an OHP mode is set, and if the OHP mode is set, the first carrier motor 37 is rotated at a high speed and the second carrier motor 38 is rotated at a low speed so that only the carrying speed of the developer sheet 18 from the heat fixing stage to the ejection stage is at a low speed (Steps S5 and S6).

In the pressure developing device 20, the microcapsule sheet 14 with a latent image formed thereon is placed and pressed on the developer sheet 18, whereby an image is transferred and developed on the developer sheet 18. Thereafter, hot air is blown against the developer sheet 18 in the heat fixing device 24, whereby an image on the developer sheet 18 is heated and fixed (Step S7).

Accordingly, when the enlarged mode is set, it is not necessary to change the heating temperature of the heater 34 in the heat fixing device 24 to a temperature lower than that when the equal mode is set, and heat fixing can be done in a short period of time at the same heating temperature as that of the equal mode to shorten the overall time required for image formation. When the OHP mode is set, the heat fixing time becomes prolonged because the second carrier motor 38 is rotated at a low speed, and therefore, it is not necessary to change the heating temperature of the heater 34 to a high temperature but heat fixing can be slowly effected at the same heating temperature as that of the equal mode, to obtain an output image having a stabilized quality. Furthermore, the sheet is not heated during the OHP mode, and therefore, no curl occurs in the OHP sheet. A possibility of sheet jams can thus be prevented.

While this invention has been described in conjunction with specific embodiments thereof, it is evident that many alternatives, modifications and variations will be apparent to those skilled in the art. For example, the distance between the pressing roller 20a of the pressure developing device 20 and the feed-in roller 27 of the heat fixing device 24 can be made shorter than the length of the developer sheet 18 having the maximum dimension used, whereby when the enlarged mode or OHP mode is set, the heating temperature of the heater 34 in the heat fixing device 24 is changed only during the time when the developer sheet 18 is carried across the first and second carrier devices C1 and C2, so as to prevent an occurrence of uneven glossiness in the outputted image. Furthermore, a heat roller type device may be used as the heat fixing device 24. Accordingly, the preferred embodiments of the invention as set forth herein are intended to be illustrative, not limiting. Various changes may be made without departing from the spirit and scope of the invention as defined in the following claims.

What is claimed is:

1. An image forming apparatus comprising:
   exposing means for exposing a photosensitive recording medium to light carrying image information so as to form a latent image on the photosensitive recording medium;
   feeding means for feeding a developer sheet;
   developing means for superposing the exposed photosensitive recording medium on the developer sheet, and for transferring the latent image on the photosensitive recording medium to the developer sheet;
   heat fixing means for heat fixing the image formed on the developer sheet;
   ejecting means for ejecting heat-fixed developer sheet from said image forming apparatus;
   first carrying means for carrying the developer sheet from said feeding means to said developing means;
   second carrying means for carrying the developed developer sheet from said heat fixing means to said ejecting means;
   first driving means for driving said first carrying means;
   second driving means for driving said second carrying means; and
   controlling means for controlling said first and second driving means so as to change carrying speed of said first and second carrying means, respectively.

2. The image forming apparatus according to claim 1, further comprising:
   third carrying means for carrying the photosensitive recording medium, wherein said controlling means controls said first driving means such that the carrying speed of said first carrying means is coincident with a carrying speed of said third carrying means.

3. The image forming apparatus according to claim 2, further comprising:
   mode selecting means for selecting one of equal mode in which said third carrying means carries the photosensitive recording medium at high speed and enlarged mode in which said third carrying means carries the photo sensitive recording medium at low speed, wherein said controlling means controls said first and second driving means such that said first driving means drives said first carrying means at the high speed and said second driving means drives said second carrying means at the high speed when the equal mode is selected by said mode selecting means, and said first driving means drives said first carrying means at the low speed and said second driving means drives said second carrying means at the high speed when the enlarged mode is selected by said mode selecting means.

4. The image forming apparatus according to claim 3, wherein said mode selecting means selects an overhead projector or OHP mode for forming an image on a developer sheet having a resinous transparent base sheet, and wherein said controlling means controls said first and second driving means such that said first driving means drives said first carrying means at the high speed and said second driving means drives said second carrying means at the low speed when the OHP mode is selected by said mode selecting means.

5. The image forming apparatus according to claim 1, wherein said heat fixing means includes a temperature sensor, said temperature sensor providing a signal indicative of a heating temperature of the developer sheet.

6. The image forming apparatus according to claim 5, wherein said controlling means controls said heat fixing means based on comparison of a preset heating temperature with an actual heating temperature indicated by the signal of said temperature sensor so as to maintain the preset heating temperature.

7. The image forming apparatus according to claim 6, wherein said preset heating temperature is approximately 130° C.

8. The image forming apparatus according to claim 1, wherein said heat fixing means is spaced from said developing means by a distance longer than a length of the developer sheet in a developer sheet carrying direction.

9. An image forming apparatus comprising:
   exposing means for exposing a photosensitive recording medium to light carrying image information so as to form a latent image on the photosensitive recording medium;
   feeding means for feeding a developer sheet;
   developing means for superposing the exposed photosensitive recording medium on the developer sheet, and transferring the latent image on the photosensitive recording medium to the developer sheet;
   heating fixing means for heat fixing the image formed on the developer sheet;
   ejecting means for ejecting the heat fixed developer sheet from said image forming apparatus;
   first carrying means for carrying the developer sheet from said feeding means to said developing means;
   second carrying means for carrying the developed developer sheet from said heat fixing means to said ejecting means;
   a first motor for driving said first carrying
   a second motor for driving said second carrying means;
   mode selecting means for selecting one of a plurality of image formation modes;
   controlling means for controlling said first and second motors based on the image formation mode selected by said mode selecting means so as to control carrying speed of said first and second carrying means respectively.

10. The image forming apparatus according to claim 9, further comprising:
    third carrying means for carrying the photosensitive recording medium, wherein said controlling means controls said first motor such that the carrying speed of said first carrying means is coincident with a carrying speed of said third carrying means.

11. The image forming apparatus according to claim 10, wherein said mode selecting means selects one of an equal mode in which said third carrying means carries the photosensitive recording medium at high speed and an enlarged mode in which said third carrying means carries the photosensitive recording medium at low speed, and wherein said controlling means controls said first and second motors such that said first motor drives said first carrying means at the high speed and said second motor drives said second carrying means at the high speed when the equal mode is selected by said mode selecting means, and said first motor drives said first carrying means at the low speed and said second motor drives said second carrying means at the high speed when the enlarged mode is selected by said mode selecting means.

12. The image forming apparatus according to claim 11, wherein said mode selecting means selects an overhead projector or OHP mode for forming an image on a developer sheet having a resinous transparent base sheet and said controlling means controls said first and second motors such that said first motor drives said first carrying means at the high speed and said second motor drives said second carrying means at the low speed when the OHP mode is selected by said mode selecting means.

13. The image forming apparatus according to claim 9, wherein said heat fixing means includes a heater for heating the developer sheet, and said controlling means includes means for controlling a heating temperature of the developer sheet by controlling said heater.

14. The image forming apparatus according to claim 13, wherein said heating temperature control means includes means for detecting the heating temperature of the developer sheet, and said heating temperature control means controls the heating temperature of the developer sheet based on comparison of a predetermined target temperature with an actual temperature detected by said heating temperature detecting means.

15. A method of transporting a developer sheet in an image forming apparatus comprising an exposing means for exposing a photosensitive recording medium to light carrying image information so as to form a latent image on the photosensitive recording medium, feeding means for feeding the developer sheet, developing means for superposing the exposed photosensitive recording medium to the developer sheet, heat fixing means for heat fixing the image formed on the developer sheet and ejecting means for ejecting the heat fixed developer sheet from the image forming apparatus, the method comprising the steps of:

carrying the developer sheet from the feeding means to the developing means using a first carrying means;

carrying the developed developer sheet from the heat fixing means to the ejecting means using a second carrying means; and independently controlling the speed of movement of said first and second carrying means.

16. The method as recited in claim 15, further comprising selecting a mode of operation of said image forming apparatus from an equal mode, an enlarged mode and an overhead projector or OHP mode.

17. The method as recited in claim 16, including moving the first and second carrying means at approximately the same speed when said equal mode is selected.

18. The method as recited in claim 15, including moving the first carrying means at a low speed and moving the second carrying means at a high speed when said enlarged mode is selected.

19. The method as recited in claim 16, including moving the first carrying means at a high speed and moving the second carrying means at a low speed when said OHP mode is selected.

20. The method as recited in claim 16, further comprising maintaining a preset heating temperature for said heat fixing.

* * * * *